United States Patent [19]

Kondo et al.

[11] Patent Number: 5,650,983
[45] Date of Patent: Jul. 22, 1997

[54] PRINTED CIRCUIT BOARD MAGNETIC HEAD FOR MAGNETO-OPTICAL RECORDING DEVICE

[75] Inventors: Masamichi Kondo, Tokyo; Masataka Ogawa, Chiba, both of Japan

[73] Assignee: Sony Corporation, Tokyo, Japan

[21] Appl. No.: 705,067

[22] Filed: Aug. 29, 1996

Related U.S. Application Data

[63] Continuation of Ser. No. 474,524, Jun. 7, 1995, abandoned, which is a continuation of Ser. No. 234,244, Apr. 28, 1994, abandoned.

[30] Foreign Application Priority Data

Apr. 28, 1993 [JP] Japan .................... 5-103209

[51] Int. Cl.$^6$ ........................... G11B 11/00
[52] U.S. Cl. .............................. 367/13; 360/114
[58] Field of Search ........................ 369/13, 14; 360/59, 360/114, 123, 125, 122, 126, 103, 102

[56] References Cited

U.S. PATENT DOCUMENTS

| | | | |
|---|---|---|---|
| 4,652,954 | 3/1987 | Church | 360/120 |
| 4,807,210 | 2/1989 | Kaku et al. | 369/44 |
| 4,823,217 | 4/1989 | Kato et al. | 360/104 |
| 4,970,615 | 11/1990 | Gau | 360/126 |
| 5,065,270 | 11/1991 | Koyanagi et al. | 360/123 |
| 5,124,870 | 6/1992 | Toyoda | 360/126 |
| 5,140,568 | 8/1992 | Yoda | 369/13 |
| 5,170,302 | 12/1992 | Matsumoto | 360/123 |
| 5,293,360 | 3/1994 | Hasegawa et al. | 369/13 |
| 5,305,294 | 4/1994 | Kime et al. | 369/13 |
| 5,331,495 | 7/1994 | Yoshida et al. | 360/126 |
| 5,404,342 | 4/1995 | Ohmori | 369/13 |

FOREIGN PATENT DOCUMENTS

| | | |
|---|---|---|
| 0 291 248 A2 | 11/1988 | European Pat. Off. . |
| 61-267905 | 11/1986 | Japan . |
| 63-55704 | 3/1988 | Japan . |
| 63-193319 | 8/1988 | Japan . |
| 63-249905 | 10/1988 | Japan . |
| 3-224109 | 10/1991 | Japan . |
| 4-010202 | 1/1992 | Japan . |

OTHER PUBLICATIONS

Patent Abstracts of Japan, vol. 10, 76 (P–440) (2133), 26 Mar. 1986 & JP-A-60 214 438 Suwa Seikosha K.K.).
Patent Abstracts of Japan, vol. 13, No. 9 (P–811) (3357), 11 Jan. 1989 & JP-A-63 217 547 (Fujitsu Ltd.).
Patent Abstracts of Japan, vol. 9, No. 156 (P–368) (1879), 29 Jun. 1985 & JP-A-60 29 904 (Seiko Denshi Kogyo K.K.).
Patent Abstracts of Japan, vol. 14, No. 409 (P–1101) (4352), 5 Sep. 1990 & JP-A-02 158 942 (Fuji Electric Co. Ltd.).
Patent Abstracts of Japan, vol. 14, No. 402 (P–1099) (4345), 30 Aug. 1990 & JP-A-21 54 348 (Nippon Telegram & Telegraph Corp.), 13 Jun. 1990.
Patent Abstracts of Japan, vol. 15, No. 75 (P–1169), 21 Feb. 1991 & JP-A-22 94 903 (Mitsubishi Electric Corp.), 5 Dec. 1990.
Patent Abstracts of Japan, vol. 13, No. 389 (P–925), 29 Aug. 1989 & JP-A-11 37 419 (Fuji Photo Film Co. Ltd.), 30 May 1989.
Patent Abstracts of Japan, vol. 13, No. 85 (P–834), 27 Feb. 1989 & JP-A-63-268 110 (Matsushita Electric Ind. Co. Ltd.), 30 May 1989.
Research Disclosure, No. 323, Mar. 1991, RD32378, Emsworth, GBR; ANON: "Low Radiation Head Design for Magneto-Optic Direct Overwrite."

(List continued on next page.)

Primary Examiner—Tan Dinh
Attorney, Agent, or Firm—Limbach & Limbach L.L.P.

[57] ABSTRACT

A magnetic head applies a magnetic field to a desired area when recording an information signal on the desired recording area of a magneto-optical disk. This magnetic head comprises a printed circuit board and a coil formed on at least one of the surfaces of the printed circuit board by a conductor pattern. This magnetic head can be made smaller, lighter and thinner than conventional magnetic heads.

9 Claims, 3 Drawing Sheets

OTHER PUBLICATIONS

Japanese Journal of Applied Physics, vol. 28 (1989), supplement 28-3, pp. 329-33; G. Fujita et al.: "A Magneto-Optical Recording Method of Magnetic Field Modulation with Pulsed Laser Irridation."

Japanese Utility Model Application No. 01-136416, "Overwrite Magnetic Head for Magneto-Optical Recording."

Proceedings of the Optical Memory Symposium, Tokyo, Japan, 1988; T. Watanabe et al.: "High Speed Overwriting Method for Magneto-Optical Recording."

Topical Meeting on Optical Data Storage, Mar. 5-7, 1990, Vancouver, Canada, pp. 151-154; F. Tanaka et al.: "Advanced Magneto-Optical Disk Drive and Media," *Conference Digest.*

Topical Meeting on Optical Data Storage, Mar. 5-7, 1990, Vancouver, Canada, pp. 160-162; H. Izumi et al.: "Overwrite Characteristics of Magneto-Optical Disks by Magnetic Field Modulation," Conference Digest.

Topical Meeting on Optical Data Storage, Mar. 5.-7, 1990, Vancouver, Canada, pp. 168-171 plus 7 additional unnumbered pages; T. Yamagami et al.: "High Density Magnetio-Optical Recording with Magnetic Field Modulation and Pulsed Laser Irradiation," Conference Digest.

Topical Meeting on Optical Data Storage, Mar. 5-7, 1990, Vancouver, Canada, pp. 176-179; S. Sujaya et al.: "Magnetic Field Modulation Overwrite Characteristics for Magneto-Optical Disks Using an Active Head-to-Disk Spacing Control Method," Conference Digest.

Journal of Applied Physics, 63(8), 15 Apr. 1988, pp. 3847-3849, J.J.M. Ruigrok et al: "Design and Performance of Magnetic Heads for Magneto-Optic Recording with Magnetic Field Modulation."

PRINTED CIRCUIT BOARD MAGNETIC HEAD FOR MAGNETO-OPTICAL RECORDING DEVICE

This is a continuation of application No. 08/474,524 filed on Jun. 7, 1995 and now abandoned which, in turn, is a continuation of application No. 08/234,244, filed on Apr. 28, 1994 and now also abandoned.

BACKGROUND OF THE INVENTION

1. Field of the Invention

The present invention relates to a magnetic head for use with a magneto-optical disk recording apparatus, for example.

2. Description of the Related Art

Magneto-optical disk recording and reproducing apparatus that can record and reproduce a magneto-optical disk of 64 mm diameter accommodated in a disk cartridge, i.e., a so-called mini disc (MD) are now commercially available on the market.

Heretofore, having erased recorded information magnetically recorded on a magneto-optical disk by radiating laser light on the magneto-optical disk, the magneto-optical disk recording and reproducing apparatus overwrites new recording information by a magnetic field modulation overwrite head (simply referred to hereinafter as "magnetic head"), the information being in the form of a magnetic signal of "1" or "0".

It has been customary for the user to carry the magneto-optical disk recording and reproducing apparatus when in use. Therefore, the magneto-optical disk recording and reproducing apparatus should be made small, light and thin. One effective method of solving the above-mentioned problem is to make the magnetic head small, light and thin.

However, the conventional magneto-optical disk recording and reproducing apparatus includes a magnetic head which comprises a bulk core, such as an E-type core or the like, around which conductors are wound many times. Accordingly, this type of conventional magnetic head is comparatively large in spacing factor (i.e., ratio of volume of conductors relative to the whole volume of the magnetic head). There is then the disadvantage that the magnetic head itself becomes large in size.

Moreover, because magnetic heads are generally electromagnetically shielded, it is unavoidable that a metal shield member serving as the electromagnetic shield member is complicated in shape because the magnetic heads are generally three-dimensional in shape.

OBJECTS AND SUMMARY OF THE INVENTION

It is therefore an object of the present invention to provide an improved magnetic head in which the aforesaid shortcomings and disadvantages of the related art can be eliminated.

Another object of the present invention is to provide a magnetic head which can be miniaturized.

Still another object of the present invention is to provide a magnetic head which can-be made lightweight.

Still another object of the present invention is to provide a magnetic head which can be reduced in thickness.

According to an aspect of the present invention, there is provided a magnetic head for applying a magnetic field to a desired area when recording an information signal on the desired recording area of a magneto-optical disk. This magnetic head is comprised of a printed circuit board and a coil formed on at least one of the surfaces of the printed circuit board by a conductor pattern.

According to other aspect of the present invention, there is provided a magnetic head in which a printed circuit board is formed of a laminated printed circuit board of at least two layers.

Further, according to a further aspect of the present invention, there is provided a magnetic head in which a printed circuit board having a coil is formed as one body with a core.

Furthermore, according to a still further aspect of the present invention, there is provided a magnetic head in which a printed circuit board is formed of a flexible printed circuit board.

In accordance with the present invention, the magnetic head can be made smaller, lighter and thinner than conventional magnetic heads in which a coil is formed by a plurality of turns of conductors.

If the printed circuit board is formed of the laminated printed circuit board of at least two layers, then a magnetic field of much higher intensity can be obtained.

If the printed circuit board having the coil is unitarily formed with the core, then a generated magnetic field becomes much stronger.

Furthermore, if the printed circuit board is formed of the flexible printed circuit board, then the magnetic head can be made much smaller, lighter and thinner.

BRIEF DESCRIPTION OF THE DRAWINGS

A better understanding of other objects, features, and advantages of the present invention can be gained from a consideration of the following detailed description of illustrative embodiments, in conjunction with the figures of the accompanying drawings, in which.

DETAILED DESCRIPTION OF THE PREFERRED EMBODIMENTS

A magnetic head according to the present invention will now be described in detail with reference to the drawings.

Figure 1:
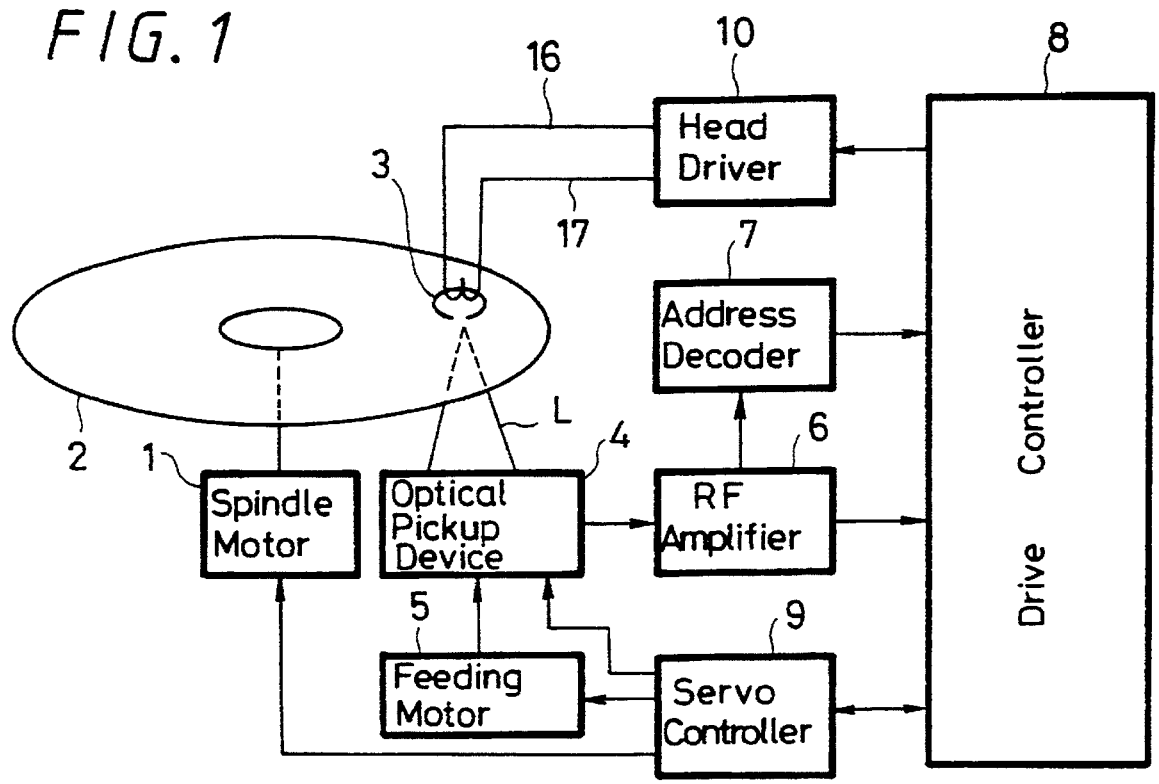
FIG. 1 is a block diagram showing a circuit arrangement of a magneto-optical recording and reproducing apparatus in which a magnetic head according to the present invention is assembled.

FIG. 1 of the accompanying drawings shows in schematic block form a circuit arrangement of a magneto-optical recording and reproducing apparatus in which a magnetic head according to the present invention is assembled.

As shown in FIG. 1, a recording magnetic head 3 and an optical pickup device 4 having an objective lens for converging laser light L are opposed to each other across a magneto-optical disk 2 which is rotatable by a spindle motor 1 at a constant linear velocity (CLV).

The recording magnetic head 3 and the optical pickup device 4 are translated by a feeding motor 5 in substantially the radial direction of the magneto-optical disk 2.

The magneto-optical disk recording and reproducing apparatus reproduces the magneto-optical disk 2 by the optical pickup device 4 as follows.

The magneto-optical disk 2 has on its recording portion pre-grooves (not shown) formed previously. The optical pickup device 4 reproduces an RF signal corresponding to the pre-groove and an RF amplifier 6 amplifies the reproduced RF signal supplied thereto to provide a binary signal. This binary signal is supplied to an address decoder 7 which supplies the address signal and an FM carrier signal to a drive controller 8.

The drive controller 8 includes some suitable circuit elements, such as an encoder, a decoder and a CPU (central processing unit), though not shown. The drive controller 8 is responsive to the address signal and the FM carrier signal supplied thereto from the address decoder 7 to enable a servo controller 9 to control the rotational speed of the spindle motor 1 and the feeding motor 5 to place the optical pickup device 4 at a proper position.

Also, the optical pickup device 4 reproduces the magnetic signal of "1" or "0" recorded on the magneto-optical disk 2 to provide an electrical signal of "1" or "0". The reproduced signal is supplied through the RF amplifier 6 to the drive controller 8. The drive controller 8 decodes the RF signal supplied thereto from the RF amplifier 6 by the incorporated decoder (not shown) to reproduce the magnetic signal recorded on the magneto-optical disk 2 as an information signal.

Recording operation of the magneto-optical disk recording and reproducing apparatus will be described below.

The drive controller 8 encodes a recording information signal supplied thereto from the outside by the incorporated encoder (not shown) to provide a binary voltage signal, and supplies the same to a head driver 10. The head driver 10 converts the binary voltage signal supplied thereto from the drive controller 8 to provide a binary current signal and supplies the binary current signal to the recording magnetic head 3 through lead wires 16, 17.

The optical pickup device 4 and the spindle motor 1 are driven under servo control as described above. The recording magnetic head 3 serves as a magnetic field modulation overwrite magnetic head and records a magnetic signal of "1" or "0", corresponding to the binary current signal on the disk surface of the magneto-optical disk 2 in its magnetic recording film (not shown) that had been formed by the radiation of the laser light L emitted from the optical pickup device 4.

Figure 2:
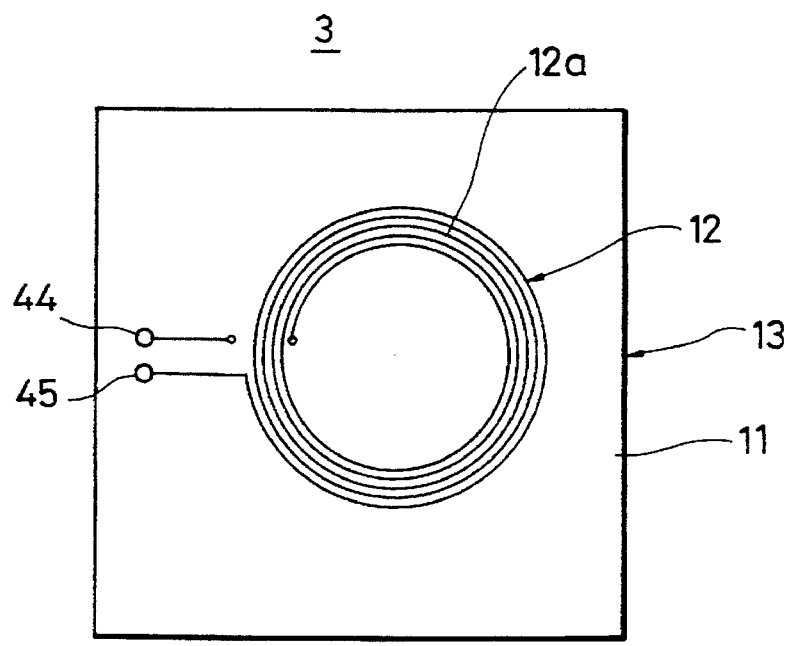
FIG. 2 is a plan view showing an arrangement of a magnetic head according to a first embodiment of the present invention.

FIG. 2 is a plan view showing an arrangement of the recording magnetic head 3 according to a main portion of the present invention. In this embodiment, as shown in FIG. 2, the magnetic head 3 is a so-called plane head which utilizes a printed circuit board 13 formed of a glass epoxy base 11 on which a spiral-shaped conductor pattern 12a is formed to provide a coil 12. A dimension of the printed circuit board 13 is about 5×5 mm$^2$ and the number of turns in the coil 12 is 20, for example.

The magnetic head 3 includes input terminals 44, 45 defined at respective ends of the coil 12 which is formed by a plurality of turns of the spiral-shaped conductor pattern 12a. The input terminals 44, 45 are connected with output terminals of the head driver 10 through the lead wires 16, 17 (see FIG. 1). Because the magnetic head 3 thus arranged generates a magnetic flux in the axial direction of the coil 12, the magnetic head 3 is disposed such that its surface on which the coil 12 is formed becomes parallel to the disk surface of the magneto-optical disk 2.

The magnetic head 3 formed of the printed circuit board 13 having the coil 12 can be made small, light and thin as compared with the conventional magnetic heads using the conductors. The conductor pattern 12a of the coil 12 can be designed with a freedom so that the input terminals 44, 45, etc., can be formed at proper positions.

The printed circuit board 13 might be either a single-sided printed circuit board or a double-sided printed circuit board. If the printed circuit board 13 is of the type of the double-sided printed circuit board, the spiral-shaped coil formed of the conductor pattern may be formed on both surfaces of the printed circuit board concentrically in an opposing relation so that intensities of magnetic fields of both coils are increased. When the coils are formed on both surfaces of the printed circuit board, if the dimensions of the printed circuit boards 13 are the same as each other, then intensity of magnetic field generated from the magnetic head 3 is increased as compared with intensity of magnetic field generated from the printed circuit board in which the coil is formed on one surface. When the coil is formed on both surfaces of the printed circuit board, the printed circuit board 13 which can generate a magnetic field whose intensity is the same as that of the magnetic field generated from the printed circuit board in which the coil is formed on one surface can be reduced in dimension.

Further, when the coil is not formed on both surfaces of the printed circuit board, if the rear surface of the surface in which the coil 12 is formed is formed of a single pattern (single copper foil pattern), then an electromagnetic shield can be formed with ease. If the single-sided printed circuit board is electromagnetically shielded, then it is sufficient that a metal foil, such as a copper foil or the like, may be bonded to the opposite surface of the surface in which the coil is formed. Therefore, the electromagnetic shield can be formed on the single-sided printed circuit board with ease as compared with the prior art. Also, when the coil is formed on both surfaces of the printed circuit board, the metal foil may be bonded to the surface through an insulating film, such that the electromagnetic shield can be formed on the printed circuit board with ease.

The printed circuit board 13 is not limited to a relatively hard material, such as the glass epoxy base 11 or the like, and may be a film-like flexible printed circuit board made of material such as a polyimide resin material, polytetrafluoroethylene resin material or the like. When the flexible printed circuit board is used, the magnetic head can be made smaller, lighter and thinner.

Figure 3:
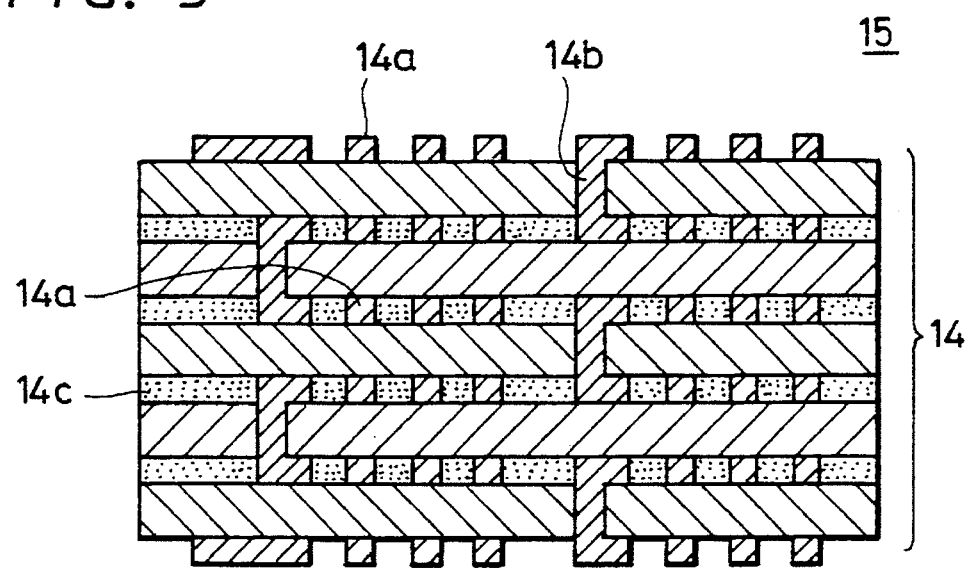
FIG. 3 is, a cross-sectional view showing an arrangement of a magnetic head according to a second embodiment (laminated printed circuit board) of the present invention.

It is possible to form a magnetic head 15 by a laminated printed circuit board 14 having two layers or more, e.g., five layers as shown in FIG. 3. In the laminated printed circuit board 14, spiral-shaped, concentric conductor patterns 14a between adjacent layers are connected together by means of a hole 14b. The layers are bonded to each other by an adhesive 14c. In FIG. 3, input terminals that are to be connected to the lead wires 16, 17 (FIG. 1) from the head driver 10 are not shown and those input terminals can, of course, be formed on the same surface side by using through-holes. If the printed circuit board is formed of the laminated printed circuit board having two layers or more, then intensity of the generated magnetic field can be increased much more as compared with the first embodiment shown in FIG. 2 when the multiple coils are concentric. Also in the case of the laminated printed circuit board 14, if the opposite surface (outermost surface) of the surface in which the coil is formed in an opposing relation to the magneto-optical disk 2 is formed as a single pattern (single copper leaf pattern), then the electromagnetic shield can be formed on the laminated printed circuit board 14 with ease.

Figure 4:
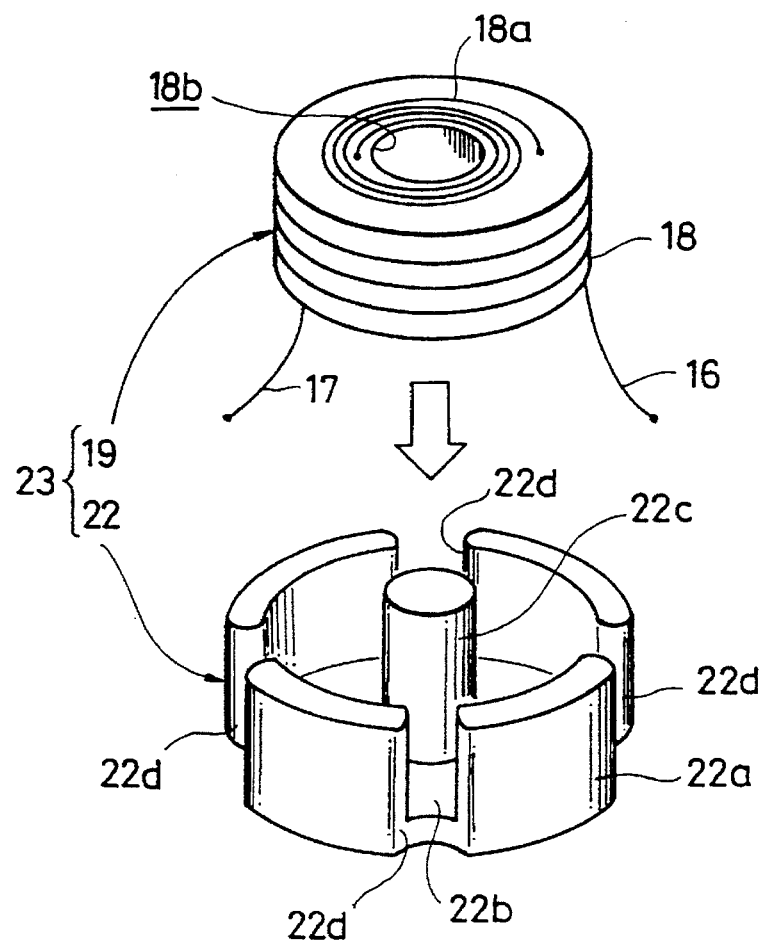
FIG. 4 is a perspective view showing a magnetic head according to a third embodiment (pot core integrated type) of the present invention in an exploded fashion.

When it is intended to generate a stronger magnetic field, a magnetic head 23 can be formed which comprises a cylindrical laminated coil 19 formed of a multi-layer laminated printed circuit board (e.g., 4-layer laminated printed circuit board) 18 composed of spiral coils made of conductor patterns 18a laminated on respective layers and a pot core 22 made of a magnetic material, such as ferrite or the like, as shown in FIG. 4.

The pot core 22 comprises a cylindrical portion 22a serving as a side wall portion, a bottom wall portion 22b and a center columnar portion 22c upwardly extended from the bottom wall portion 22b along the axial direction. The pot core 22 includes four recesses 22d, 22d, 22d, 22d defined from the cylindrical portion 22a to the bottom wall portion 22b at an angular spacing of 90 degrees. The cylindrical portion 22a is about 3 mm in height, about 6 mm in outer diameter and is about 5 mm in inner diameter. The center columnar portion 22c is about 1 mm in diameter.

As shown by the open arrow in FIG. 4, when the magnetic head 23 is assembled, the laminated coil 19 is housed into the hollow inside portion of the pot core 22 under the condition that the shaft aperture 18b of the laminated coil 16 is in alignment with the center columnar portion 22c of the pot core 22. Then, the laminated coil 19 and the pot core 22 are secured together by an adhesive. At that time, if the lead wires 16, 17 are led out of the laminated coil 19 and taken out from the two recesses 22d, 22d which are disposed at an angular extent of 180 degrees, then the lead wires 16, 17 can be led out of the bottom wall portion 22b.

Figure 5:
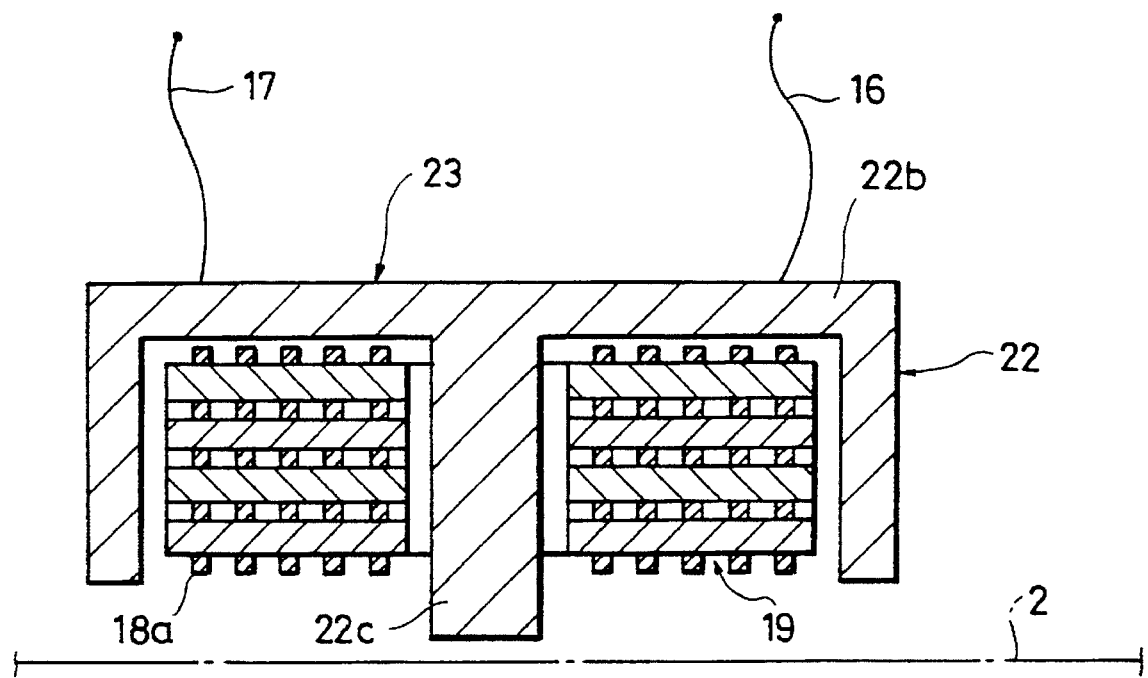
FIG. 5 is a cross-section view showing the magnetic head (FIG. 4) obtained after assembly, and to which reference will be made in explaining a positional relationship between the magnetic head and the magneto-optical disk.

FIG. 5 shows in a cross-sectional fashion the arrangement of the magnetic head 23 (FIG. 4) in which the laminated coil 19 is accommodated within the hollow inside portion of the pot core 22. As shown in FIG. 5, an upper surface side of the pot core 22 (side opposing the magneto-optical disk 2 in FIG. 5) is a magnetic flux generating surface, and disposed in an opposing relation to the disk surface of the magneto-optical disk 2 so that, if the lead wires 16, 17 are led out of the bottom wall portion 22b side of the pot core 22, then the magnetic head 23 can be disposed close to the disk surface of the magneto-optical disk 2.

According to the magnetic head 23 shown in FIGS. 4 and 5, it is possible to generate a much stronger magnetic field. Although the magnetic head 23 according to the third embodiment can generate a magnetic field whose intensity is higher as compared with the conventional magnetic head which comprises the E-type core and the conductors wound on the E-type core, the number of steps for manufacturing the magnetic head 23 can be reduced considerably. Therefore, the magnetic head 23 can be manufactured inexpensively on the whole.

Figure 6:
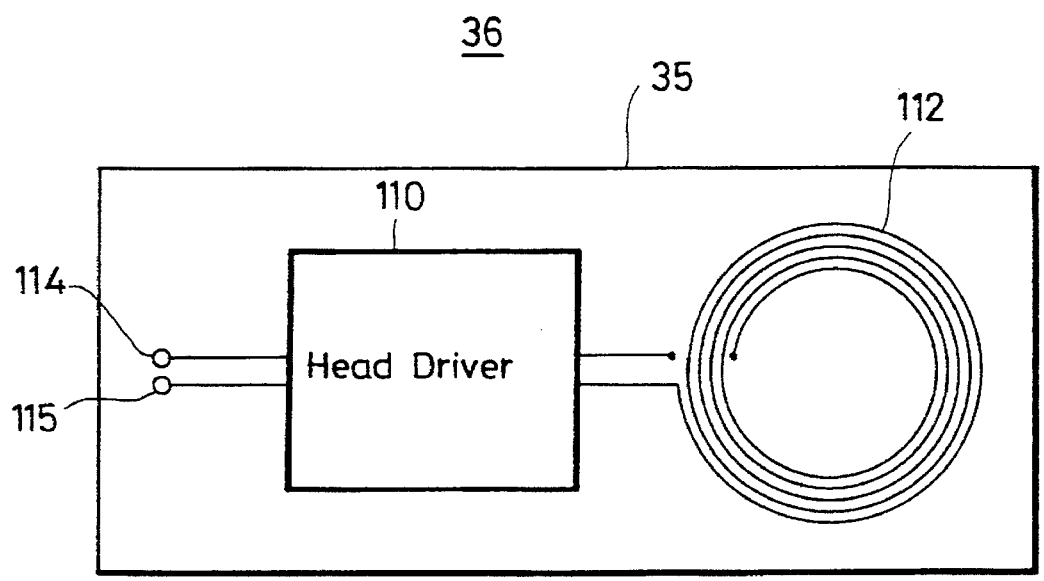
FIG. 6 is a diagram showing a magnetic head according to a fourth embodiment (head driver integrated type) of the present invention.

FIG. 6 shows a magnetic head according to a fourth embodiment of the present invention. According to this embodiment, a magnetic head 36 comprises a coil 112 and a head driver 110 both of which are formed on one printed circuit board 35 as shown in FIG. 6. According to the magnetic head 36 of the head driver integrated type, it is possible to reduce a drive current (current supplied to the coil 112) of the head driver 110 as compared with the magnetic head 3 in which the head driver 10 and the coil 12 are connected by means of the lead wires 16, 17 shown in FIGS. 1 and 2. According to the fourth embodiment shown in FIG. 6, since a current amplitude on the input sides of the head driver 110 (input terminals 114, 115 side), i.e., the side connected to the drive controller 8 (see FIG. 1) is small as compared with a current amplitude on the output side (side connected to the coil 112) of the head driver 110, a stray impedance (i.e., inductance and capacitance) can be excited with a small electric power.

According to the first-embodiment shown in FIG. 2, since the printed circuit board 13 having the coil 12 formed on its one or both surfaces by the conductor pattern 12a is used as the magnetic head 3, the magnetic head can be made small, light and thin as compared with the conventional magnetic head in which the coil is formed by a plurality of turns of the conductors.

According to the second embodiment shown in FIG. 3, the magnetic head 19 is formed by the 5-layer laminated printed circuit board 14 having the coil formed of the conductor pattern 14a. When the magnetic head 19 is formed of the laminated printed circuit board 14 as described above, it is possible to obtain a much stronger magnetic field.

Further, according to the third embodiment shown in FIGS. 4 and 5, since the magnetic head 23 comprises the laminated printed circuit board 18 in which the laminated coil 19 is formed of the conductor pattern 18a and the pot core 22 into which the laminated printed circuit board 18 is accommodated, a magnetic flux is concentrated in the pot core 22 and therefore a magnetic field of much higher intensity can be obtained.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A magnetic head for applying a magnetic field to a desired area when recording an information signal on a desired recording area of a magneto-optical disk, comprising:

a printed circuit board having first and second opposing surfaces;

a coil formed on at least one of the surfaces of said printed circuit board by a conductor pattern; and a pot core made of a magnetic material within which said printed circuit board is housed.

2. A magnetic head according to claim 1, wherein said coil is formed on both surfaces of said printed circuit board.

3. A magnetic head according to claim 1, wherein at least two printed circuit boards are laminated, each of said circuit boards bearing a coil on at least one of the surfaces of said printed circuit boards, said coils of said respective circuit boards being concentric.

4. A magnetic head according to claim 1, wherein said printed circuit board is a flexible printed circuit board.

5. A magnetic head according to claim 1, wherein said printed circuit board includes thereon a driving circuit for driving said coil.

6. A magnetic head according to claim 1 wherein said printed circuit board is formed of a glass epoxy.

7. A magnetic head according to claim 1 wherein said printed circuit board is formed of a polymer.

8. A magnetic head for applying a magnetic field to a desired area when recording an information signal on a desired recording area of a magneto-optical disk, comprising:

first and second printed circuit boards laminated together, each of said circuit boards having first and second opposing surfaces;

a coil formed on each of said opposing surfaces of said printed circuit board; and a pot core made of a magnetic material within which said printed circuit board is housed.

9. A magnetic head according to claim 8 wherein said printed circuit boards are flexible.

* * * * *